(12) United States Patent
Qu

(10) Patent No.: US 10,916,727 B2
(45) Date of Patent: Feb. 9, 2021

(54) OLED SUBSTRATE AND PACKAGING METHOD AND DISPLAY APPARATUS THEREOF

(71) Applicants: Beijing BOE Display Technology Co., Ltd., Beijing (CN); BOE TECHNOLOGY GROUP CO., LTD., Beijing (CN)

(72) Inventor: Lianjie Qu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 69 days.

(21) Appl. No.: 16/228,909

(22) Filed: Dec. 21, 2018

(65) Prior Publication Data
US 2019/0221769 A1    Jul. 18, 2019

(30) Foreign Application Priority Data
Jan. 17, 2018   (CN) .......................... 2018 1 0044516

(51) Int. Cl.
*H01L 51/52*   (2006.01)
*H01L 51/56*   (2006.01)
(Continued)

(52) U.S. Cl.
CPC ...... *H01L 51/5253* (2013.01); *H01L 27/3246* (2013.01); *H01L 27/3248* (2013.01);
(Continued)

(58) Field of Classification Search
CPC ............ H01L 51/5253; H01L 27/3246; H01L 27/3248; H01L 27/3258; H01L 51/525;
(Continued)

(56) References Cited

U.S. PATENT DOCUMENTS

2002/0158835 A1   10/2002  Kogayashi et al.
2017/0117337 A1*   4/2017  Kimura ............... H01L 51/5246

FOREIGN PATENT DOCUMENTS

| CN | 101296539 | 10/2008 |
| CN | 103794631 | 5/2014 |
| CN | 106876331 | 6/2017 |

OTHER PUBLICATIONS

Office action from Chinese Application No. 201810044516.4 dated Apr. 12, 2019.
(Continued)

*Primary Examiner* — Matthew E Warren
(74) *Attorney, Agent, or Firm* — Calfee, Halter & Griswold LLP

(57) ABSTRACT

An OLED substrate and a packaging method and a display apparatus thereof are provided. The method for packaging the OLED substrate includes: forming a functional layer having a slit on a substrate where a pixel defining layer and an OLED device are formed, the slit corresponding to a pattern location of the pixel defining layer; etching the pixel defining layer by using the functional layer as a mask to obtain the pixel defining layer having a groove; and forming a packaging thin film on the pixel defining layer having the groove and the functional layer to obtain a thin-film packaging layer sinking into the groove.

18 Claims, 7 Drawing Sheets

(51) Int. Cl.
  *H01L 27/32* (2006.01)
  *H01L 51/00* (2006.01)
(52) U.S. Cl.
  CPC ...... *H01L 51/0017* (2013.01); *H01L 51/0097* (2013.01); *H01L 51/56* (2013.01); *H01L 2227/323* (2013.01); *H01L 2251/10* (2013.01); *H01L 2251/5338* (2013.01); *H01L 2251/56* (2013.01)
(58) Field of Classification Search
  CPC ..... H01L 51/17; H01L 51/56; H01L 2251/10; H01L 2251/56
  See application file for complete search history.

(56) References Cited

OTHER PUBLICATIONS

Second Office Action for Chinese Patent Application No. 201810044516.4 dated Jan. 20, 2020.

\* cited by examiner

| Classif- ication | Epoxy resin package | Frit package | Transparent packaging | Thin-film packaging |
|---|---|---|---|---|
| Structu- re | 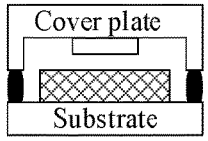 | 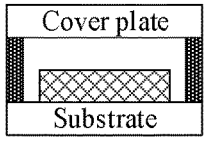 | 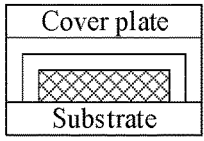 | 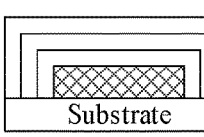 |
| Concept | Glass etching getter adheres to UV edge packaging | Completely sealed | Adhesive film packaging | Thin-film packaging |
| Advan- tages | Simple process and high reliability | High transparency and no need of getter | Achievable large size and good resistance to mechanical damage | Ultrathin panel Available for flexible display |
| Probl- em | Top emission type is difficult in application | Poor resistance to mechanical damage Reinforced seal | Thin-film bezel | High investment |
| Status | Bottom emission type | Large-scale mass production | In progress | In progress |

FIG. 1

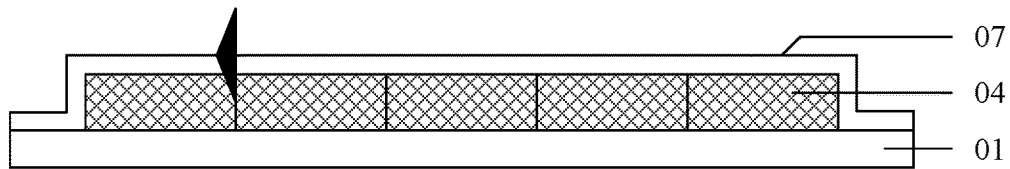

FIG. 3

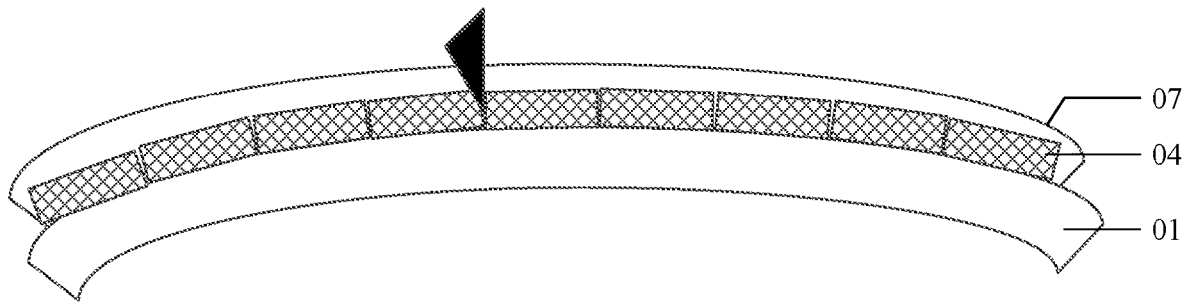

FIG. 4

| Form a planar pattern layer 300 having a slit 40 on a substrate where a pixel defining layer 10 and an OLED device 20 are formed, wherein the slit 40 corresponds to a pattern location of the pixel defining layer 10 | S10 |
|---|---|
| Etch the pixel defining layer 10 by using the planar pattern layer 300 as a mask to obtain the pixel defining layer 10 having a groove 100 | S20 |
| Form a packaging thin film above the pixel defining layer 10 having the groove 100 and the planar pattern layer 300 to obtain a thin-film packaging layer 50 sinking into the groove 100 | S30 |

FIG. 5

OLED SUBSTRATE AND PACKAGING METHOD AND DISPLAY APPARATUS THEREOF

CROSS REFERENCE

This application is based upon and claims priority to Chinese Patent Application No. 201810044516.4, filed on Jan. 17, 2018, the entire contents thereof are incorporated herein by reference.

TECHNICAL FIELD

The present disclosure generally relates to the field of display technologies, and more particularly, to an OLED substrate and a packaging method and a display apparatus thereof.

BACKGROUND

Organic light emitting diode (OLED) has many advantages such as wide viewing angle, high brightness, high contrast, low voltage DC drive, active light emission, simple preparation technology, ultrathin and portable characteristics, etc., and thus it is widely recognized as a new generation of display technology followed by cathode ray tube (CRT), liquid crystal display (LCD), and plasma display panel (PDP), and its display quality is comparable to the LCD actively driven by a thin film transistor (TFT), but its price is much cheaper than the TFT. Therefore, the OLED technologies pose a challenge to the widely-used LCD technologies.

So far, great progress has been made in the OLED technologies, red light emitting materials, green light emitting materials and blue light emitting materials have been successfully developed, and luminous intensity and luminous efficiency have reached a full-color display of practical level. However, compared with the LCD and the PDP, the OLED is shorter in service life, which is still one of important factors restricting its commercialization.

It is to be noted that the above information disclosed in this Background section is only for enhancement of understanding of the background of the present disclosure and therefore it may contain information that does not form the prior art that is already known to a person of ordinary skill in the art.

SUMMARY

The present disclosure provides an OLED substrate and a packaging method and a display apparatus thereof.

Other features and advantages of the present disclosure will become apparent from the following detailed description, or in part, by practice of the present disclosure.

According to an aspect of the present disclosure, there is provided a method for packaging an OLED substrate, which includes:

forming a functional layer having a slit on a substrate where a pixel defining layer and an OLED device are formed, the slit corresponding to a pattern location of the pixel defining layer;

etching the pixel defining layer by using the functional layer as a mask to obtain the pixel defining layer having a groove; and forming a packaging thin film on the pixel defining layer having the groove and the functional layer to obtain a thin-film packaging layer sinking into the groove.

In an exemplary embodiment of the present disclosure, a maximum width of the slit is smaller than a maximum width of the pixel defining layer but is greater than a maximum width of the groove.

In an exemplary embodiment of the present disclosure, the forming a functional layer having a slit on a substrate where a pixel defining layer and an OLED device are formed includes:

forming a plurality of array-arranged subpixels on a substrate, each of the subpixels including a thin film transistor and a pixel electrode electrically connected to the thin film transistor;

forming the pixel defining layer between adjacent subpixels on the pixel electrode;

sequentially forming an organic light emitting layer and a common electrode in a region defined by the pixel defining layer; and forming a photosensitive resin layer on the common electrode to serve as a planar layer; and patterning the planar layer to obtain the functional layer having the slit, the pixel electrode, the common electrode, and the organic light emitting layer positioned between the pixel electrode and the common electrode constitute the OLED device.

In an exemplary embodiment of the present disclosure, the patterning the planar layer to obtain the functional layer having the slit includes:

coating a layer of photoresist on the substrate where the planar layer is formed;

exposing and developing the substrate where the photoresist is formed by using a mask to obtain a photoresist-removed portion and a photoresist-reserved portion, wherein the photoresist-removed portion corresponds to a location of a to-be-formed slit;

etching the planar layer exposed from the photoresist-removed portion to form the slit in the planar layer; and peeling the remaining photoresist off.

In an exemplary embodiment of the present disclosure, the forming a functional layer having a slit on a substrate where a pixel defining layer and an OLED device are formed includes:

forming a plurality of array-arranged subpixels on a substrate, each of the subpixels including a thin film transistor and a pixel electrode electrically connected to the thin film transistor;

forming the pixel defining layer between adjacent subpixels on the pixel electrode;

sequentially forming an organic light emitting layer and a common electrode in a region defined by the pixel defining layer; and forming the functional layer having the slit on the common electrode;

The pixel electrode, the common electrode, and the organic light emitting layer positioned between the pixel electrode and the common electrode constitute the OLED device.

In an exemplary embodiment of the present disclosure, the etching the pixel defining layer by using the functional layer as a mask includes:

in the case where the OLED substrate is a flexible substrate, determining an etching depth of the pixel defining layer based on a bend radius of the flexible substrate; and etching the pixel defining layer by using the functional layer as a mask based on the determined etching depth.

In an exemplary embodiment of the present disclosure, the packaging method further includes:

forming a cover plate or a protective layer on the thin-film packaging layer by means of an adhesion layer.

In an exemplary embodiment of the present disclosure, the thin-film packaging layer is formed by atomic layer deposition.

In an exemplary embodiment of the present disclosure, a portion of connection points are reserved in a horizontal direction and a longitudinal direction to implement the electrical connection of the common electrode.

In an exemplary embodiment of the present disclosure, a portion of connection points are reserved in the horizontal direction or the longitudinal direction to implement the electrical connection of the common electrode in a single direction, and in another direction, parallel electrical connection is implemented in a peripheral non-display region.

According to an aspect of the present disclosure, there is provided an OLED substrate, which includes:

a substrate;

a pixel defining layer and an OLED device positioned on the substrate, a side of the pixel defining layer diverging from the substrate being provided with a groove;

a functional layer positioned on the pixel defining layer and the OLED device, the functional layer being provided with a slit at a groove location corresponding to the pixel defining layer; and a thin-film packaging layer positioned on the functional layer and the pixel defining layer, the thin-film packaging layer sinking into the groove of the pixel defining layer.

In an exemplary embodiment of the present disclosure, a maximum width of the slit is smaller than a maximum width of the pixel defining layer but is greater than a maximum width of the groove.

In an exemplary embodiment of the present disclosure, the OLED substrate further includes:

a cover plate or a protective layer positioned on the thin-film packaging layer.

In an exemplary embodiment of the present disclosure, the OLED device further includes:

an array-arranged pixel electrode positioned on the substrate, an organic light emitting layer positioned on the pixel electrode, and a common electrode positioned on the organic light emitting layer.

In an exemplary embodiment of the present disclosure, a portion of connection points are reserved in a horizontal direction and a longitudinal direction to implement the electrical connection of the common electrode.

In an exemplary embodiment of the present disclosure, a portion of connection points are reserved in the horizontal direction or the longitudinal direction to implement the electrical connection of the common electrode in a single direction, and in another direction, parallel electrical connection is implemented in a peripheral non-display region.

According to an aspect of the present disclosure, there is provided a display apparatus, which includes the above-mentioned OLED substrate.

It should be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and together with the description serve to explain the principles of the present disclosure. Apparently, the accompanying drawings in the following description show merely some embodiments of the present disclosure, and persons of ordinary skill in the art may still derive other drawings from these accompanying drawings without creative efforts.

FIG. 1 schematically illustrates schematic diagrams of several common packaging methods and characteristics thereof;

FIG. 3 schematically illustrates a schematic diagram showing corrosion diffusion of the OLED device according to the comparative example of the present disclosure;

FIG. 4 schematically illustrates a schematic diagram showing fracture of a packaging layer of the OLED device according to the comparative example of the present disclosure;

FIG. 5 schematically illustrates a flowchart of a method for packaging an OLED substrate according to an exemplary embodiment of the present disclosure;

DETAILED DESCRIPTION

Figure 2:
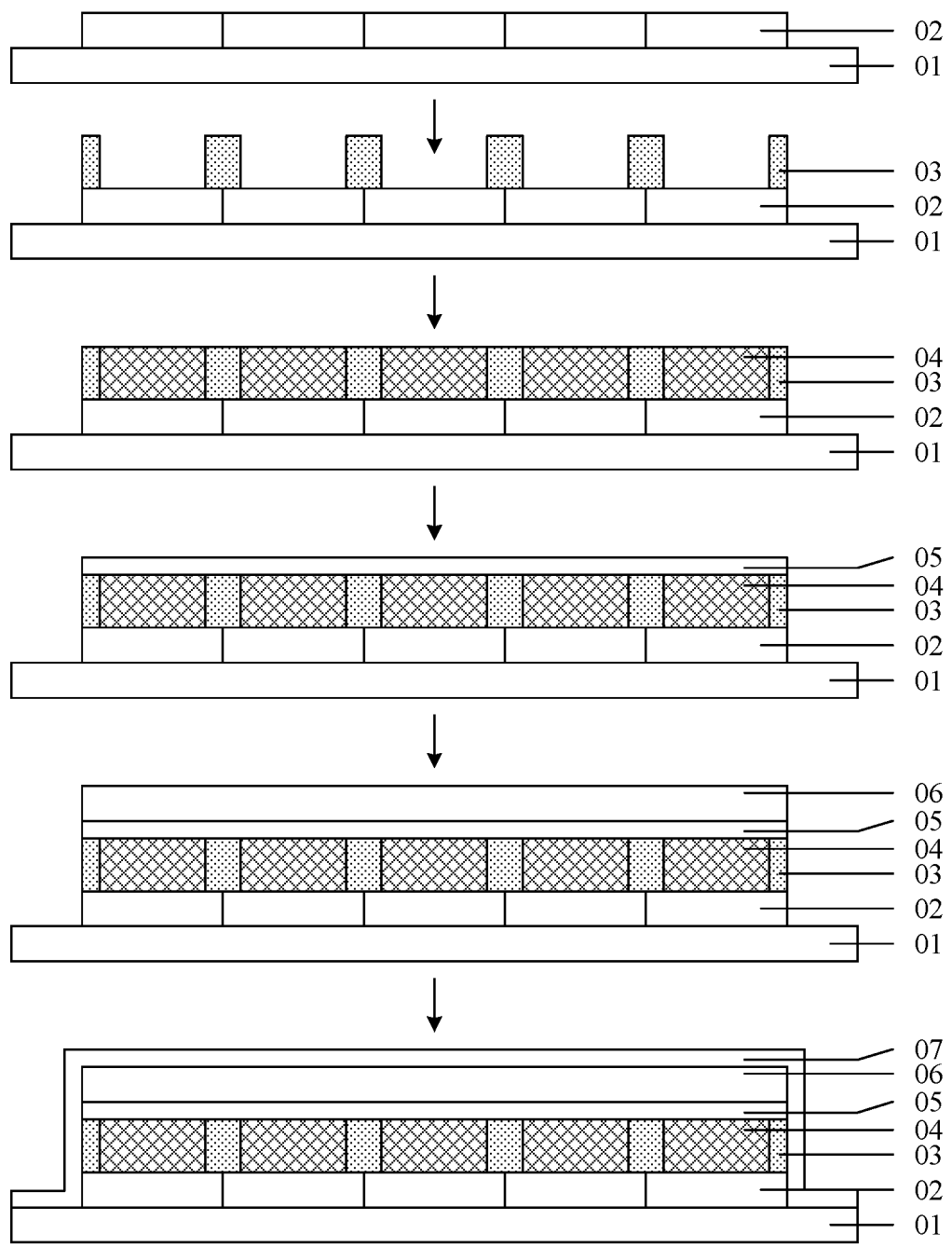
FIG. 2 schematically illustrates a thin-film packaging flowchart of an OLED device according to a comparative example of the present disclosure.

Exemplary embodiments will be described more comprehensively by referring to accompanying drawings now. However, the exemplary embodiments can be embodied in many forms and should not be construed as limited to the embodiments set forth herein; rather, these embodiments are provided so that this disclosure will be made thorough and complete, and the concept of exemplary embodiments will be fully conveyed to those skilled in the art. Furthermore, the described features, structures, or characteristics may be combined in any suitable manner in one or more embodiments.

In addition, the accompanying drawings are merely exemplary illustration of the present disclosure, and are not necessarily drawn to scale. The same reference numerals in the drawings denote the same or similar parts, and thus repeated description thereof will be omitted. Some block diagrams shown in the figures are functional entities and not necessarily to be corresponding to a physically or logically individual entities. These functional entities may be implemented in software form, or implemented in one or more hardware modules or integrated circuits, or implemented in different networks and/or processor apparatuses and/or microcontroller apparatuses.

Due to advantages such as wide viewing angle, high brightness, high contrast and low voltage DC drive, OLED is expected to become a new-type display in place of an LCD. However, the OLED device is vulnerable to erosion of water vapor and oxygen in air, which has a negative effect on the service life of the OLED device. The OLED device needs to be effectively packaged to prolong its service life. FIG. 1 illustrates several current common packaging methods and characteristics thereof. In the thin-film packaging technology, compacted thin films or multilayer films may be employed to implement packaging of the OLED device, and thus invasion of water vapor and oxygen is cut off.

Main factors influencing the service life of the OLED include physical influence and chemical influence. The physical influence refers to the influence of functional layer combination and its interface, the influence of cathode materials, the glass transition temperature of a hole transport layer, and a drive mode, etc. The chemical influence refers to cathodic oxidation and crystallization of the hole transport layer, etc. Studies have shown that constituents in air such as water vapor and oxygen have a great effect on the service life of the OLED. The main reasons may be considered from the following aspects: when an OLED device works, electrons need to be injected from its cathode, which requires the cathode work function to be the lower the better. However, metallic materials serving as the cathode such as aluminum, magnesium, calcium and so on are relatively active, and thus the cathode may easily react with the infiltrated water vapor, and the water vapor also may chemically react with the hole transport layer and the electron transport layer, thereby causing failure of the OLED device, etc. Based on this, if the OLED device can be effectively packaged to separate the functional layers of the OLED device from the constituents in air such as water vapor and oxygen, it will be advantageous to prolong the service life of the OLED device.

Exemplarily, FIG. 2 illustrates a thin-film packaging flowchart of the OLED device, which may roughly include following steps:

S1: performing TFT backplate process on a substrate 01 to obtain a TFT array 02;

S2: forming a pixel defining layer 03 on the TFT backplate to normalize a fabrication region of the OLED;

S3: fabricating a light emitting layer EL04 in the region normalized by the pixel defining layer 03 by way of printing or evaporation to obtain a red sub-pixel R, a green sub-pixel G and a blue sub-pixel B;

S4: fabricating an electrode layer 05 such as a magnesium/silver (Mg/Ag) electrode or an indium tin oxide (ITO) electrode on the light emitting layer EL04;

S5: fabricating a planar layer 06 such as a resin layer on the electrode layer 05; and S6: forming a compacted film layer on the planar layer 06 to serve as a packaging layer 07 by using, for example, an atomic layer deposition (ALD) device to implement packaging of the OLED device.

Based on the above thin-film packaging structure and the thin-film packaging process, although packaging of the OLED device may be implemented by a thinner film layer, the potential risk as shown in FIG. 3 and FIG. 4 still likely exists. In one aspect, as can be known by referring to FIG. 3, during planar display, if water-oxygen corrosion occurs in a certain pixel, the corrosion may be horizontally expanded to other adjacent pixels, thereby causing large area defect. In another aspect, as can be known by referring to FIG. 4, during flexible display, the distance between the packaging layer and the substrate is too large, such that the packaging layer may deform greatly when the substrate bends, which easily leads to cracks and thus causes invasion of water vapor and oxygen, thereby reducing the reliability.

Figure 6:
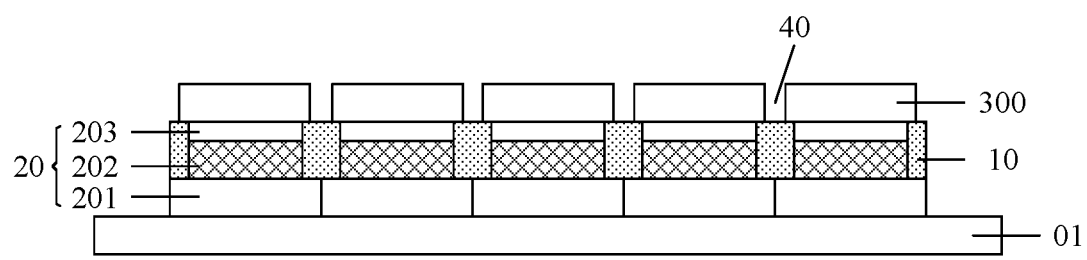
FIG. 6-FIG. 8 schematically illustrate schematic diagrams of procedures for packaging the OLED substrate according to an exemplary embodiment of the present disclosure.
Figure 7:
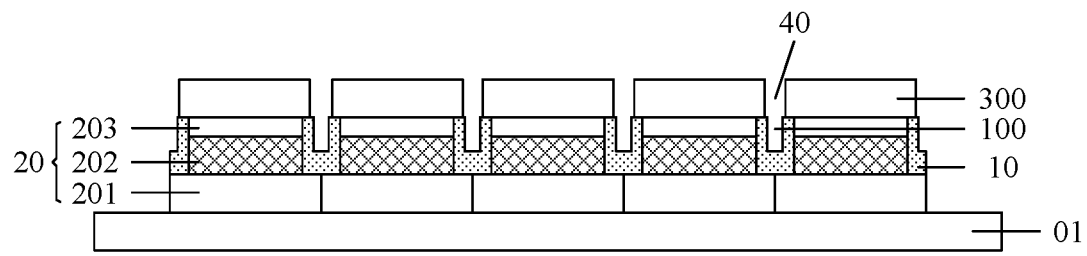
Figure 8:
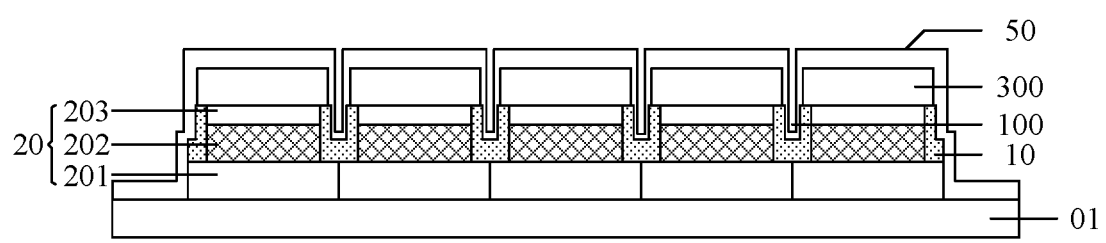

On this basis, this exemplary embodiment provides a method for packaging an OLED substrate. As shown in FIG. 5, the packaging method may include following steps:

S10: referring to FIG. 6, forming a planar pattern layer 300 (e.g., a functional layer) having a slit 40 on a substrate where a pixel defining layer 10 and an OLED device 20 are formed, wherein the slit 40 corresponds to a pattern location of the pixel defining layer 10;

S20: referring to FIG. 7, etching the pixel defining layer 10 by using the planar pattern layer 300 as a mask to obtain the pixel defining layer 10 having a groove 100; and S30: referring to FIG. 8, forming a packaging thin film on the pixel defining layer 10 having the groove 100 and the planar pattern layer 300 to obtain a thin-film packaging layer 50 sinking into the groove 100.

Figure 9:
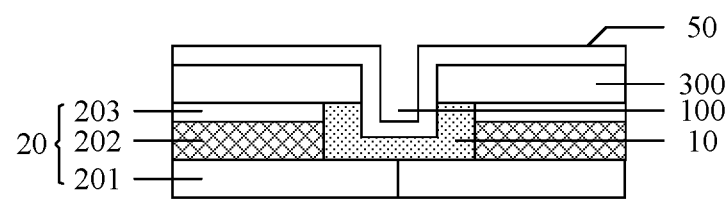
FIG. 9 schematically illustrates an enlarged view of a packaging structure of the OLED substrate according to an exemplary embodiment of the present disclosure.

According to the method for packaging an OLED substrate provided by the exemplary embodiments of the present disclosure, the pixel defining layer 10 beneath the planar pattern layer 300 is etched by using the planar pattern layer 300 having the slit 40 as a mask, such that the groove 100 is formed in the pixel defining layer 10. In this way, a thin-film packaging layer 50 formed on the groove 100 may sink into the groove 100. FIG. 9 illustrates an enlarged view of a packaging structure of the OLED substrate obtained based on this packaging method. Based on this packaging method, in one aspect, the thin-film packaging layer 50 corresponding to the pixel defining layer 10 may be formed in the groove 100 between adjacent pixels to implement pixel-level packaging. In this way, the phenomenon of horizontal expansion of water-oxygen corrosion of a certain pixel to other adjacent pixels may be improved, deterioration and expansion of pixels are avoided, large area defect is prevented, and thus the service life of an OLED device is prolonged. In another aspect, the distance between the thin-film packaging layer 50 corresponding to the pixel defining layer 10 and the substrate may be reduced to reduce stress generated by deformation of the flexible substrate, and thus risk of fracture of the packaging layer of the flexible substrate is decreased, and reliability of the OLED device is enhanced.

The method for packaging the OLED device is described in detail below with reference to the accompanying drawings.

In Step S10, referring to FIG. 6, the planar pattern layer 300 having the slit 40 is formed on the substrate where the pixel defining layer 10 and the OLED device 20 are formed, wherein the slit 40 corresponds to a pattern location of the pixel defining layer 10.

In this exemplary embodiment, the pixel defining layer 10 includes a pattern used for spacing pixels. The pattern should have a certain width dimension such as 2 μm~10 μm, and with this width dimension, it is sufficient to form the groove 100 in the pattern region of the pixel defining layer 10 by means of a primary etching process. The maximum width of the slit 40 in the planar pattern layer 300 should be smaller than the maximum width of the pixel defining layer 10 but is greater than that of the groove 100 to be formed, such that the groove 100 is formed in the pattern region of the pixel defining layer 10 by means of the etching process.

Figure 10:
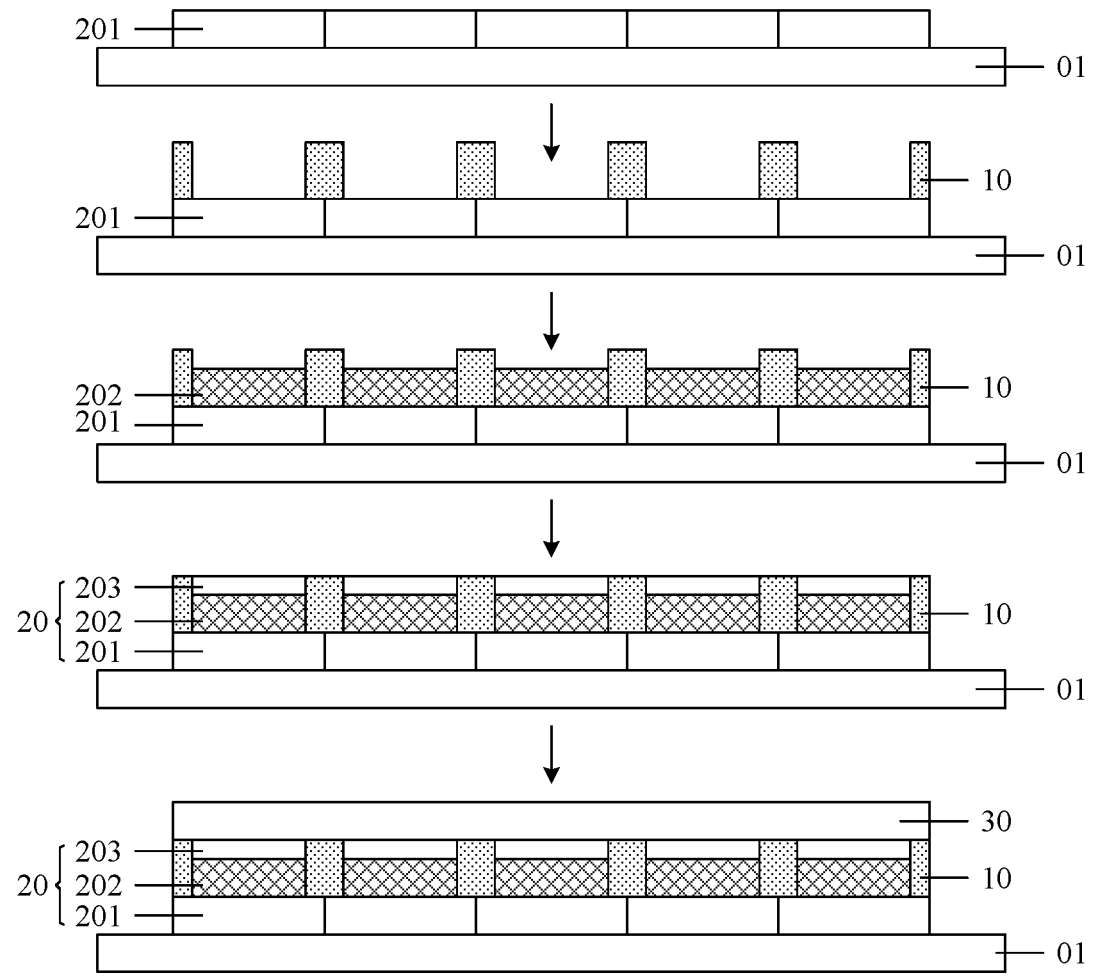
FIG. 10 schematically illustrates a schematic diagram of procedures for forming a planar layer according to an exemplary embodiment of the present disclosure.
Figure 11:
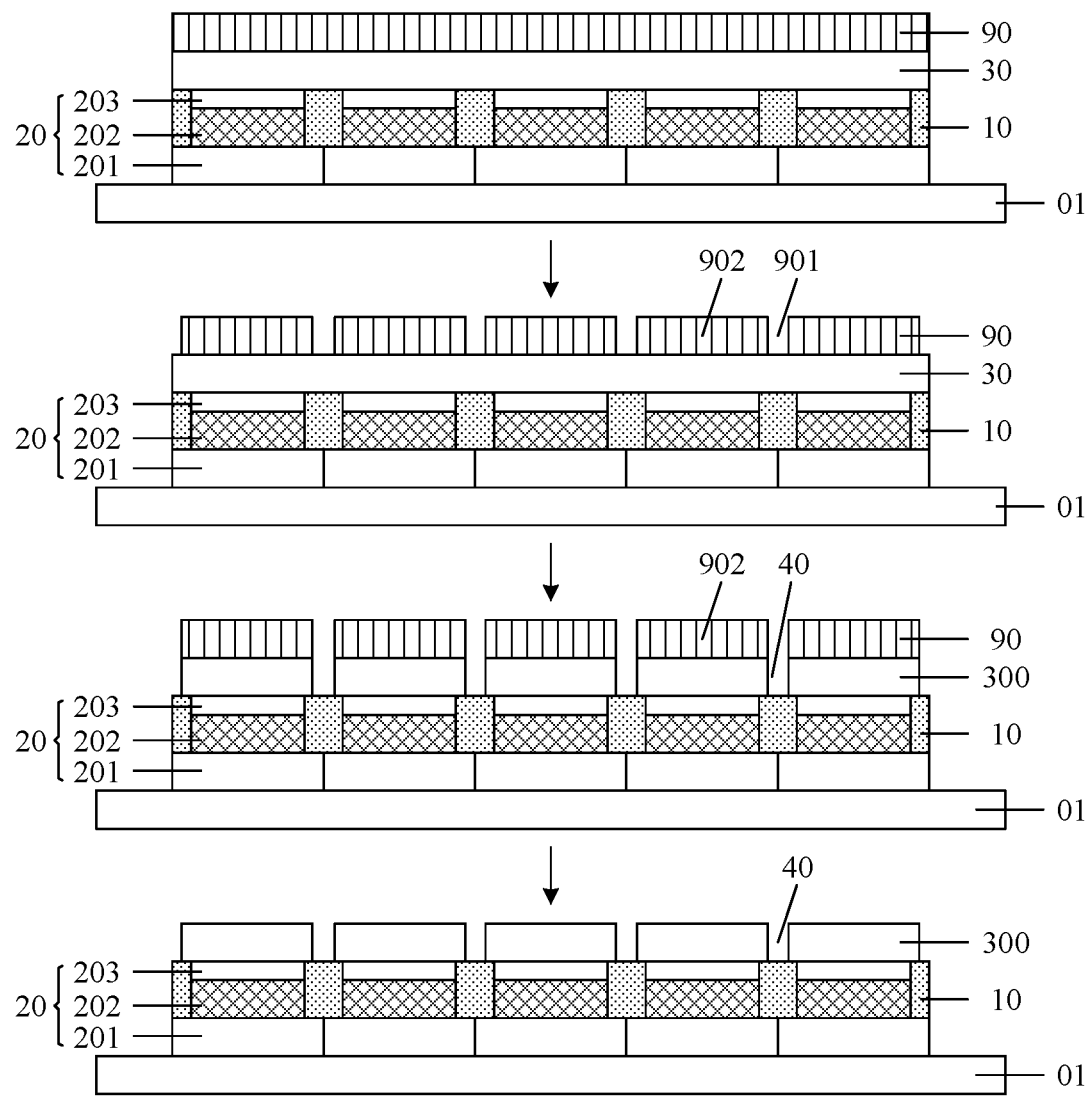
FIG. 11 schematically illustrates a schematic diagram of procedures for forming a functional layer according to an exemplary embodiment of the present disclosure.

In an embodiment of this example, referring to FIG. 10 and FIG. 11, the forming a planar pattern layer 300 having a slit 40 on a substrate where a pixel defining layer 10 and an OLED device 20 are formed may include:

S111: forming a plurality of array-arranged subpixels on a substrate 01, wherein each of the subpixels includes a thin film transistor and a pixel electrode 201 electrically connected to the thin film transistor;

S112: forming the pixel defining layer 10 having a certain width between the adjacent subpixels on the pixel electrode 201;

S113: forming an organic light emitting layer 202 in a region limited by the pixel defining layer 10 by way of printing or evaporation, and forming a common electrode 203 on the organic light emitting layer 202;

S114: forming a photosensitive resin layer on the common electrode 203 using a low temperature film forming technology to serve as a planar layer 30; and S115: patterning the planar layer 30 to obtain the planar pattern layer 300 having the slit 40.

The OLED device 20 includes the pixel electrode 201, the common electrode 203, and the organic light emitting layer 202 between the pixel electrode 201 and the common electrode 203. One of the pixel electrode 201 and the common electrode 203 may serve as an anode, and the other one may serve as a cathode. Electrode materials may adopt metallic materials such as Mg/Ag alloys or metallic oxide materials such as ITO, etc.

It is to be noted that the patterning process refers to composing the planar layer 30 by using a mask to form patterns required in the planar layer 30 by way of a photolithographic process. Exemplarily, referring to FIG. 11, specific procedures of patterning the planar layer 30 are as follows:

S115-1: coating a layer of photoresist 90 on a substrate where the planar layer 30 is formed, wherein the photoresist 90 may be a positive photoresist or a negative photoresist;

S115-2: exposing and developing the substrate where the photoresist 90 is formed by using the mask to obtain a photoresist-removed portion 901 and a photoresist-reserved portion 902, wherein the photoresist-removed portion 901 corresponds to the location of the to-be-formed slit 40;

S115-3: etching the planar layer 30 exposed from the photoresist-removed portion 901 to form the slit 40 in the planar layer 30; and S115-4: peeling the remaining photoresist 90 off to obtain the planar pattern layer 300 having the slit 40.

In another embodiment of this example, the forming a planar pattern layer 300 having a slit 40 on a substrate where a pixel defining layer 10 and an OLED device 20 are formed includes:

S121: forming a plurality of array-arranged subpixels on a substrate 01, wherein each of the subpixels includes a thin film transistor and a pixel electrode 201 electrically connected to the thin film transistor;

S122: forming the pixel defining layer 10 having a certain width between the adjacent subpixels on the pixel electrode 201;

S123: forming an organic light emitting layer 202 in a region limited by the pixel defining layer 10 by way of printing or evaporation, and forming a common electrode 203 on the organic light emitting layer 202; and S124: directly forming the planar pattern layer 300 having the slit on the common electrode 203 through evaporation.

The OLED device 20 includes the pixel electrode 201, the common electrode 203, and the organic light emitting layer 202 positioned between the pixel electrode 201 and the common electrode 203. One of the pixel electrode 201 and the common electrode 203 may serve as an anode, and the other one may serve as a cathode. Electrode materials may adopt metallic materials such as Mg/Ag alloys or metallic oxide materials such as ITO, etc.

As can be seen, in this exemplary embodiment, the planar pattern layer 300 having the slit 40 may be formed by forming a photosensitive resin and exposing and developing the photosensitive resin. Furthermore, the planar pattern layer 300 having the slit 40 may be directly formed on the common electrode 203 by way of evaporation. The present disclosure does not specifically limit methods of forming the planar pattern layer 300.

Figure 12:
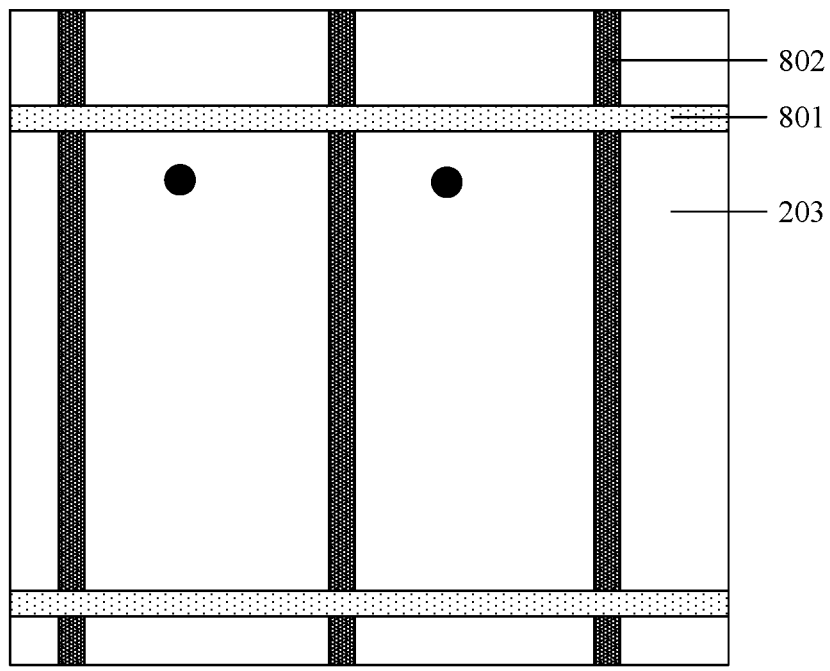
FIG. 12 schematically illustrates a schematic diagram of a connection mode of a common electrode.

Based on the above structure, the common electrode 203 does not use the conventional planar structure as shown in FIG. 12, but uses a blocky structure formed in each subpixel. Therefore, special design needs to be made for each blocky electrode to implement electrical connection of the electrodes.

Figure 13:
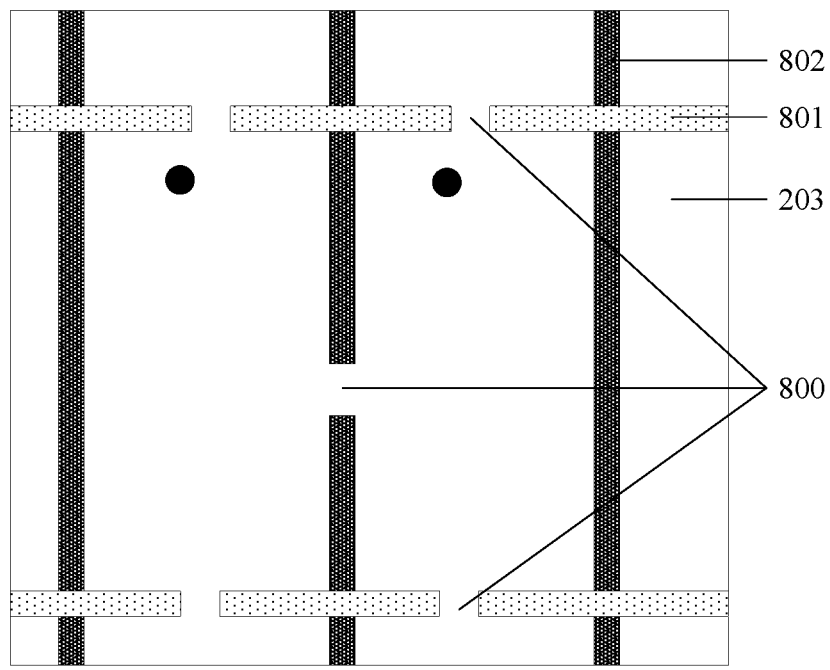
FIG. 13 schematically illustrates a schematic diagram of a connection mode of a common electrode according to an exemplary embodiment of the present disclosure.

Referring to FIG. 13, there are three connection modes of the common electrode 203 in this embodiment as below. In the first connection mode, a portion of connection points 80 are reserved in a horizontal direction such as the direction of a gate line 801 and in a longitudinal direction such as the direction of a data line 802 to implement the electrical connection of the common electrode 203. In the second connection mode, a portion of connection points 80 are reserved in the horizontal direction such as the direction of the gate line 801 or in the longitudinal direction such as the direction of the data line 802 to implement the electrical connection of the common electrode 203 in a single direction. While in another direction, parallel electrical connection may be implemented in a peripheral non-display region, such that only the connection points 80 in one direction may be reserved, and thus pixel-level packaging level is improved. In the third connection mode, when an ITO electrode is used, the ITO electrical connection has less effect on a problem of small size, but is demanding for large-sized resistors. Therefore, the number of points of electrical connection may be increased to reduce resistance, or a metal layer is increased on an upper layer to reduce the integral resistance.

It is to be noted that in this exemplary embodiment, the organic light emitting layer 202 of each sub-pixel may directly use color light emitting material such as light emitting materials that can directly emit red light, green light and blue light, or also may use other light emitting materials such as light emitting materials that can emit while light. At this moment, color display may be implemented by collocating photoresistors of each color such as red light photoresistors, green light photoresistors, and blue light photoresistors.

In Step S20, referring to FIG. 7, the pixel defining layer 10 is etched by using the planar pattern layer 300 as the mask to obtain the pixel defining layer 10 having the groove 100.

The etching process may be a dry etching process or a wet etching process. The etching depth may be set according to actual requirements, and an extreme position thereof requires that the pixel defining layer 10 can be exactly and completely etched. In the meanwhile, it is also needed to consider process implementation difficulty.

In the case that the OLED substrate is a flexible substrate, in consideration of a fact that bend of the flexible substrate may cause the packaging layer to deform due to effect of stress. Therefore, the etching depth of the pixel defining layer 10 may be designed based on the bend radius of a flexible product. The greater the bend radius is, the larger the etching depth is.

Exemplarily, etching the pixel defining layer 10 by using the planar pattern layer 300 as a mask to obtain the pixel defining layer 10 having a groove 100 specifically may include:

S201: when the OLED substrate is a flexible substrate, determining the etching depth of the pixel defining layer 10 based on the bend radius of the flexible substrate; and S202: etching the pixel defining layer 10 by using the planar pattern layer 300 as the mask based on the determined etching depth to obtain the pixel defining layer 10 having the groove 100.

As thus, the groove 100 having a certain depth is formed in the pixel defining layer 10 according to the actual needs. That is, the distance from the upper surface of the pixel defining layer 10 to the substrate 01 may be reduced, such that the packaging layer can get close to the substrate as much as possible when forming the thin-film packaging layer 50.

In Step S30, referring to FIG. 8, a packaging thin film is formed on the pixel defining layer 10 having the groove 100 and the planar pattern layer 300 to obtain a thin-film packaging layer 50 sinking into the groove 100.

The thin-film packaging layer 50 may be a single-layer packaging structure or a multilayer packaging structure, and the multilayer packaging structure may be packaged by using a method in which an organic film layer alternates with an inorganic film layer.

In this exemplary embodiment, the thin-film packaging layer 50 may form a compacted film layer on the pixel defining layer 10 having the groove 100 and the planar pattern layer 300 by using an ALD device or the like. In the meanwhile, the thin-film packaging layer 50 also may cover boundaries of the pixel defining layer 10, such that good water-blocking and oxygen-inhibiting characteristics may be implemented by using a thinner film layer.

Based on the above procedures, in consideration of anti-scratch performances of the OLED substrate, the method for packaging the OLED substrate may further include:

S40: forming a glass cover plate or a protective layer on the thin-film packaging layer 50 by means of an adhesion layer.

The pixel-level packaging structure formed based on the above steps S10-S40 not only may improve deterioration and expansion of pixels but also may decrease risk of fracture of the packaging layer of the flexible substrate. In addition, the OLED substrate has anti-scratch performances, and thus is an OLED device having high reliability.

This exemplary embodiment further provides an OLED substrate, which is prepared by using the above packaging method. Referring to FIG. 8, the OLED substrate may include:

a substrate 01;

a pixel defining layer 10 and an OLED device 20 positioned on the substrate 01, wherein a side of the pixel defining layer 10 diverging from the substrate 01 is provided with a groove 100;

a planar pattern layer 300 positioned on the pixel defining layer 10 and the OLED device 20, wherein the planar pattern layer 300 is provided with a slit 40 at a groove 100 location corresponding to the pixel defining layer 10;

a thin-film packaging layer 50 positioned on the planar pattern layer 300 and the pixel defining layer 10, wherein the thin-film packaging layer 50 sinks into the groove 100 of the pixel defining layer 10; and a cover plate or a protective layer positioned on the thin-film packaging layer 50.

The OLED device 20 may include an array-arranged pixel electrode 201 positioned on the substrate 01, an organic light emitting layer 202 positioned on the pixel electrode, and a common electrode 203 positioned on the organic light emitting layer 202. One of the pixel electrode 201 and the common electrode 203 may serve as the anode, and the other one may serve as the cathode. Electrode materials may adopt metallic materials such as Mg/Ag alloys or metallic oxide materials such as ITO, etc.

According to the OLED substrate provided by this exemplary embodiment of the present disclosure, in one aspect, the thin-film packaging layer 50 corresponding to the pixel defining layer 10 may sink into the groove 100 between adjacent pixels to implement pixel-level packaging. In this way, the phenomenon of horizontal expansion of water-oxygen corrosion of a certain pixel to other adjacent pixels may be improved, deterioration and expansion of pixels are avoided, large area defect is prevented, and thus the service life of the OLED device is prolonged. In another aspect, the distance between the thin-film packaging layer 50 corresponding to the pixel defining layer 10 and the substrate may be reduced to reduce stress generated by deformation of the flexible substrate, and thus risk of fracture of the packaging layer of the flexible substrate is decreased, and reliability of the OLED device is enhanced.

In this exemplary embodiment, the size of the slit 40 in the planar pattern layer 300 is smaller than the pattern size of the pixel defining layer 10 but is greater than that of the groove 100. The pattern size of the pixel defining layer 10 may be set between 2 μm and 10 μm.

It is to be noted that specific details of the OLED substrate have been described in detail in the method for fabricating the OLED substrate, and thus their detailed descriptions are omitted herein.

This exemplary embodiment further provides a display apparatus, which includes the foregoing OLED substrate. The display apparatus may weaken horizontal water-oxygen corrosion intensity of pixels to prolong the service life of the OLED device and decrease the risk of fracture of the packaging layer of the flexible substrate, and thus the reliability of the OLED device is enhanced.

The display apparatus may be any product or component having a display function, such as a mobile phone, a tablet computer, a TV set, a notebook computer, a digital photo frame, a navigation device and so on.

According to the OLED substrate and the packaging method and the display apparatus thereof provided by the exemplary embodiments of the present disclosure, a pixel defining layer beneath a planar pattern layer is etched by using the planar pattern layer having a slit as a mask, such that a groove is formed in the pixel defining layer. In this way, a thin-film packaging layer formed on the groove may sink into the groove. Based on this packaging method, in one aspect, the thin-film packaging layer corresponding to the pixel defining layer may be formed in the groove between adjacent pixels to implement pixel-level packaging. In this way, the phenomenon of horizontal expansion of water-oxygen corrosion of a certain pixel to other adjacent pixels may be improved, deterioration and expansion of pixels are avoided, large area defect is prevented, and thus the service life of an OLED device is prolonged. In another aspect, the distance between the thin-film packaging layer corresponding to the pixel defining layer and the substrate may be reduced to reduce stress generated by deformation of the flexible substrate, and thus risk of fracture of the packaging layer of the flexible substrate is decreased, and reliability of the OLED device is enhanced.

It is to be noticed that although a plurality of modules or units of the device for action execution have been mentioned in the above detailed description, this partition is not compulsory. Actually, according to the embodiment of the present disclosure, features and functions of two or more modules or units as described above may be embodied in one module or unit. Reversely, features and functions of one module or unit as described above may be further embodied in more modules or units.

In addition, steps of the method in the present disclosure are described in a particular order in the accompanying drawings. However, this does not require or imply to execute these steps necessarily according to the particular order, or this does not mean that the expected result cannot be implemented unless all the shown steps are executed. Additionally or alternatively, some steps may be omitted, a plurality of steps may be combined into one step for execution, and/or one step may be decomposed into a plurality of steps for execution.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A method for packaging an OLED substrate, comprising:
   forming a functional layer having a slit on a substrate where a pixel defining layer and an OLED device are formed, the slit corresponding to a pattern location of the pixel defining layer;
   etching the pixel defining layer to obtain the pixel defining layer having a groove; and
   forming a packaging thin film on the pixel defining layer having the groove and the functional layer to obtain a thin-film packaging layer sinking into the groove,
   wherein the thin-film packaging layer is compacted film layer formed on the pixel defining layer and the functional layer to implement packaging of the OLED substrate.

2. The method according to claim 1, wherein the step of etching the pixel defining layer to obtain the pixel defining layer having a groove comprises:
   etching the pixel defining layer by using the functional layer as a mask.

3. The packaging method according to claim 1, wherein a maximum width of the slit is smaller than a maximum width of the pixel defining layer but is greater than a maximum width of the groove.

4. The packaging method according to claim 1, wherein the step of forming a functional layer having a slit on a substrate where a pixel defining layer and an OLED device are formed comprises:
   forming a plurality of array-arranged subpixels on a substrate, each of the subpixels comprising a thin film transistor and a pixel electrode electrically connected to the thin film transistor;
   forming the pixel defining layer between adjacent subpixels on the pixel electrode;
   sequentially forming an organic light emitting layer and a common electrode in a region defined by the pixel defining layer;
   forming a photosensitive resin layer on the common electrode to serve as a planar layer; and
   patterning the planar layer to obtain the functional layer having the slit;
   wherein the pixel electrode, the common electrode, and the organic light emitting layer positioned between the pixel electrode and the common electrode constitute the OLED device.

5. The packaging method according to claim 4, wherein the step of patterning the planar layer to obtain the functional layer having the slit comprises:
   coating a layer of photoresist on the substrate where the planar layer is formed;
   exposing and developing the substrate where the photoresist is formed by using a mask to obtain a photoresist-removed portion and a photoresist-reserved portion, wherein the photoresist-removed portion corresponds to a location of a to-be-formed slit;
   etching the planar layer exposed from the photoresist-removed portion to form the slit in the planar layer; and
   peeling the remaining photoresist off.

6. The packaging method according to claim 1, wherein the step of forming a functional layer having a slit on a substrate where a pixel defining layer and an OLED device are formed comprises:
   forming a plurality of array-arranged subpixels on a substrate, each of the subpixels comprising a thin film transistor and a pixel electrode electrically connected to the thin film transistor;
   forming the pixel defining layer between adjacent subpixels on the pixel electrode;
   sequentially forming an organic light emitting layer and a common electrode in a region defined by the pixel defining layer; and
   forming the functional layer having the slit on the common electrode;
   wherein the pixel electrode, the common electrode, and the organic light emitting layer positioned between the pixel electrode and the common electrode constitute the OLED device.

7. The packaging method according to claim 2, wherein the step of etching the pixel defining layer by using the functional layer as a mask comprises:
   in the case where the OLED substrate is a flexible substrate, determining an etching depth of the pixel defining layer based on a bend radius of the flexible substrate; and
   etching the pixel defining layer by using the functional layer as a mask based on the determined etching depth.

8. The packaging method according to claim 1, further comprising:
   forming a cover plate or a protective layer on the thin-film packaging layer by means of an adhesion layer.

9. The packaging method according to claim 1, wherein the thin-film packaging layer is formed by atomic layer deposition.

10. The packaging method according to claim 4, wherein a portion of connection points are reserved in a horizontal direction and a longitudinal direction to implement the electrical connection of the common electrode.

11. The packaging method according to claim 4, wherein a portion of connection points are reserved in the horizontal direction or the longitudinal direction to implement the electrical connection of the common electrode in a single direction, and in another direction, parallel electrical connection is implemented in a peripheral non-display region.

12. An OLED substrate, comprising:
    a substrate;
    a pixel defining layer and an OLED device positioned on the substrate, a side of the pixel defining layer diverging from the substrate being provided with a groove;
    a functional layer positioned on the pixel defining layer and the OLED device, the functional layer being provided with a slit at a groove location corresponding to the pixel defining layer; and
    a thin-film packaging layer positioned on the functional layer and the pixel defining layer, the thin-film packaging layer sinking into the groove of the pixel defining layer,
    wherein the thin-film packaging layer is a compacted film layer formed on the pixel defining layer and the functional layer to implement packaging of the OLED substrate.

13. The OLED substrate according to claim 12, wherein a maximum width of the slit is smaller than a maximum width of the pixel defining layer but is greater than a maximum width of the groove.

14. The OLED substrate according to claim 12, further comprising:
    a cover plate or a protective layer positioned on the thin-film packaging layer.

15. The OLED substrate according to claim 12, wherein the OLED device comprises:
    an array-arranged pixel electrode positioned on the substrate, an organic light emitting layer positioned on the pixel electrode, and a common electrode positioned on the organic light emitting layer.

16. The OLED substrate according to claim 15, wherein a portion of connection points are reserved in a horizontal direction and a longitudinal direction to implement the electrical connection of the common electrode.

17. The OLED substrate according to claim 15, wherein a portion of connection points are reserved in the horizontal direction or the longitudinal direction to implement the electrical connection of the common electrode in a single direction, and in another direction, parallel electrical connection is implemented in a peripheral non-display region.

18. A display apparatus, comprising the OLED substrate according to claim 12.

* * * * *